March 24, 1942. O. GEISLER ET AL Re. 22,052
LIGHT SENSITIVE DEVICE
Original Filed March 31, 1934
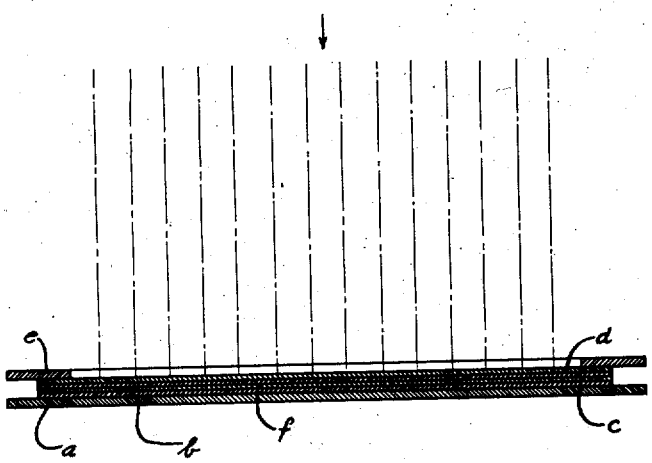
INVENTORS O. GEISLER
J. EISELE
BY Stanley B. Kent
ATTORNEY Reissued Mar. 24, 1942 Re. 22,052

UNITED STATES PATENT OFFICE 22,052

LIGHT-SENSITIVE DEVICE

Ottmar Geisler and Josef Eisele, Nuremberg, Germany, assignors, by mesne assignments, to Suddeutsche Apparatefabrik Gesellschaft m. b. H., Nuremberg, Germany, a corporation of Germany Original No. 2,096,170, dated October 19, 1937, Serial No. 718,426, March 31, 1934. Application for reissue March 3, 1938, Serial No. 195,060. In Germany April 6, 1933

2 Claims. (Cl. 136—89)

This invention relates to light-sensitive devices and more particularly to light-sensitive devices having a light-permeable electrode.

An object of the invention is to improve the light-sensitive characteristics of such devices.

In an example of practice a light-sensitive device of the blocking-layer type comprises a first light-permeable layer of a metal having low specific conductivity overlying the blocking layer and a second light-permeable layer of a metal having a higher specific conductivity overlying said first layer. The metal cadmium is used preferably for said first layer and gold for said second.

The figure of the drawing illustrates schematically a light sensitive device according to this invention.

It is well known that blocking-layer photoelectric cells constructed in layers can be provided with a transparent metal electrode. This metal electrode either is pressed upon the photosensitive layer in the form of a very thin film or applied by cathode sputtering, vaporization, or in a similar manner according to one of the known methods.

The transparent metal electrode has the task of letting through light rays, which fall upon the photoelectric cell, to the photosensitive layer and to carry off the electrons, which are liberated when the light rays strike the cell, to the edge of the cell.

Thorough experiments have disclosed that the capacity of a blocking-layer photoelectric cell in a high degree depends upon the rectifying action of its blocking layer; the activity of the blocking layer in turn depends upon the nature of the applied coating electrode.

It has been found that the metals or other materials (gold, platinum, silver, etc.) known heretofore as transparent coating electrodes were not particularly well suited for producing a good blocking layer and hence a satisfactory photoelectric effect. Experiments have shown that the rectifying action in photoelectric cells with the known coating electrodes measured with the low voltages used for operating blocking-layer photoelectric cells is only comparatively very small. After a short or long time these known coating electrode metals, owing to the constant contact, form chemical compounds with the photosensitive semi-conductive layer on the contact surface, which gradually reduce the blocking-layer photoelectric effect of the cell. In photoelectric selenium cells coated with a transparent layer of gold, gold selenides are formed between the selenium and the gold layer, for example; these selenides impair the cells.

In accordance with the invention this knowledge led to the application of metals as transparent electrode on the photosensitive layer of blocking layer photoelectric cells, particularly selenium cells, by means of which the rectifying action of the element is increased and the formation of deleterious compounds is prevented. The application of such coating electrodes produces an essentially greater power than that which was possible with the coating electrodes which were used heretofore for the blocking-layer photoelectric cells.

It has been found that the metals which, when applied as coating electrode on the photosensitive layer, form a good blocking layer or produce a good rectifying action of the blocking layer and do not form deleterious chemical compounds with the semi-conductive layer have a comparatively low conductivity compared with the coating layer metals known heretofore. Since the coating layer metals can be applied only as very thin films to obtain a high degree of transparency, the capacity of such a photoelectric cell would decrease quite considerably owing to the comparatively high voltage drop of the photoelectric current flowing through the thin, highly resistive coating film. In accordance with the invention another very thin film of a metal of high conductivity is placed on top of the first coating film, by means of which a good rectifying action of the cell is obtained.

The second coating film also should be applied to the intermediate layer by cathode sputtering or vaporization according to one of the known methods.

Through the combination of the two metallic coating films, placed on top of one another, of opposite characteristics described above a blocking layer photoelectric cell is obtained which is far superior to those known heretofore in regard to capacity.

The construction of blocking layer photoelectric cells in accordance with the invention in addition to the improved power described also has the advantage that by suitable choice of both metals used for the films or by sputtering another metal and by the choice of the thickness of each metal film the spectral sensitivity can be influenced within wide limits.

In the cells known heretofore the spectral sensitivity was changed by placing corresponding glass or color filters in front of the cells or by coating with a suitable lacquer. In the cells in accordance with the invention the filter action is obtained only by the transparent coating films without the additional losses in special connected filters.

The figure shows a blocking layer photoelectric cell in accordance with the invention which will be described in the following.

The photosensitive layer, *b*, is produced chemically or applied on a metal plate, *a*, as base plate. The transparent metal electrode, *c*, of a metal of low conductivity, which with the photosensitive layer, *b*, forms a good blocking layer, is sputtered or evaporated on the photosensitive layer, *b*. Another transparent metal electrode, *d*, of high conductivity is sputtered or evaporated on the transparent intermediate electrode, *c*; this electrode, *d*, upon illumination of the cell in the direction of the arrow carries the electrons emerging from the blocking layer to the contact ring, *e*. The blocking layer between the photosensitive layer, *b*, and the metal layer, *c*, is represented by the layer, *f*.

In the preferred embodiment of the invention the photosensitive layer, *b*, consists of selenium treated in well known manner to form a blocking layer, *f*. The layer *c*, consists of the metal cadmium and the layer, *d*, of gold. The contact ring, *e*, is of copper and plate, *a*, of copper or iron.

Various modifications of the invention differing from the specific embodiment disclosed herein come within the purview of this invention, the scope of which is defined in the appended claims.

What is claimed is:

1. A light sensitive device comprising a metallic base coated with a layer of light-sensitive selenium and a light-permeable layer covering said selenium consisting primarily of the product of the successive deposit on said selenium of cadmium and a relatively chemically inactive metal.

2. The process of making a light sensitive electric device comprising the following steps; coating one side of a metallic base plate with a layer of light sensitive material, applying a thin coating of cadmium to said light sensitive material, and applying to the cadmium a coating of a relatively chemically inacting metal of a specific conductivity higher than that of cadmium.

OTTMAR GEISLER.
JOSEPH EISELE.